United States Patent
Song

(10) Patent No.: US 12,205,644 B2
(45) Date of Patent: Jan. 21, 2025

(54) NONVOLATILE MEMORY DEVICE

(71) Applicant: SK hynix Inc., Icheon-si (KR)

(72) Inventor: Jeong Hwan Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 182 days.

(21) Appl. No.: 17/752,513

(22) Filed: May 24, 2022

(65) Prior Publication Data

US 2023/0170020 A1  Jun. 1, 2023

(30) Foreign Application Priority Data

Nov. 26, 2021 (KR) ........................ 10-2021-0165620

(51) Int. Cl.
  *G11C 16/04* (2006.01)
  *G11C 13/00* (2006.01)
(52) U.S. Cl.
  CPC ...... *G11C 13/0069* (2013.01); *G11C 13/0038* (2013.01); *G11C 13/004* (2013.01); *G11C 13/0097* (2013.01)
(58) Field of Classification Search
  CPC ............ G11C 13/0069; G11C 13/0038; G11C 13/0097
  See application file for complete search history.

(56) References Cited

U.S. PATENT DOCUMENTS

| | | | |
|---|---|---|---|
| 6,745,302 B1 * | 6/2004 | Taniguchi | G11C 8/18 711/155 |
| 6,856,574 B2 * | 2/2005 | Iwahashi | G11C 7/222 365/194 |
| 8,482,950 B2 | 7/2013 | Kitagawa et al. | |
| 10,964,376 B2 * | 3/2021 | Em | G11C 29/028 |

FOREIGN PATENT DOCUMENTS

KR   20170137562 A   12/2017

OTHER PUBLICATIONS

Yu, S. et al., "Investigating the switching dynamics and multilevel capability of bipolar metal oxide resistive switching memory." Appl. Phys. Lett. 98, 103514, 2011, 4 pages.
Yu, S. et al., "Modeling the Switching Dynamics of Programmable-Metallization-Cell (PMC) Memory and Its Application as Synapse Device for a Neuromorphic Computation System." IEEE, 2010. Downloaded May 18, 2022. 4 pages.

* cited by examiner

*Primary Examiner* — Pho M Luu
(74) *Attorney, Agent, or Firm* — Perkins Coie LLP

(57) ABSTRACT

A nonvolatile memory device is provided to include a plurality of memory cells operable to store data, each memory cell structured to include a resistance change layer exhibiting different resistance states with different resistance values for representing data, a write circuit suitable for generating a write pulse in a write mode to write data in a memory cell of the plurality of memory cells, and a read circuit suitable for generating a read pulse in a read mode to read data from a memory cell of the plurality of memory cells, wherein the memory cells are each structured to be operable in writing or reading data when a range of a voltage level change of the read pulse corresponding to a pulse width change of the read pulse is within a range of a voltage level change of the write pulse corresponding to a pulse width change of the write pulse.

19 Claims, 5 Drawing Sheets

NONVOLATILE MEMORY DEVICE

PRIORITY CLAIM AND CROSS-REFERENCE TO RELATED APPLICATION(S)

This patent document claims the priority under 35 U.S.C. § 119 to Korean Patent Application No. 10-2021-0165620, filed on Nov. 26, 2021, the disclosure of which is incorporated herein by reference in its entirety.

TECHNICAL FIELD

Various embodiments of the present disclosure relate to a semiconductor design technique, and more particularly, to a nonvolatile memory device.

BACKGROUND

A nonvolatile memory device is a memory device using nonvolatile memory cells capable of retaining stored data even when power is not supplied. For example, the nonvolatile memory device may include a magnetic random access memory (MRAM), a phase-change RAM (PCRAM), a resistance RAM (ReRAM).

SUMMARY

Various embodiments of the disclosed technology are directed to a nonvolatile memory device for reducing read disturbance.

In accordance with an embodiment, a nonvolatile memory device may include: a plurality of memory cells operable to store data, each memory cell structured to include a resistance change layer exhibiting different resistance states with different resistance values for representing data; a write circuit in communication with the memory cells and suitable for generating a write pulse in a write mode to write data in a memory cell of the plurality of memory cells wherein the write pulse has a voltage level depending on a pulse width of the write pulse; and a read circuit in communication with the memory cells and suitable for generating a read pulse in a read mode to read data from a memory cell of the plurality of memory cells, wherein the read pulse has a voltage level depending on a pulse width of the read pulse, wherein the memory cells are each structured to be operable in writing or reading data when a range of a voltage level change of the read pulse corresponding to a pulse width change of the read pulse is within a range of a voltage level change of the write pulse corresponding to a pulse width change of the write pulse.

In accordance with an embodiment, a nonvolatile memory device may include: a memory cell array including memory cells, each memory cell having a resistance change layer having a resistance that varies between a high resistance state and a low resistance state for storing data; a write circuit in communication with the memory cell array and configured to receive a mode selection signal and generate a write pulse for writing data to a memory cell based on a selected mode; and a read circuit in communication with the memory cell array and configured to generate a read pulse to read data stored in the memory cell without changing a resistance state of the memory cell, and wherein a range of a voltage level change of the read pulse corresponding to a pulse width change of the read pulse falls within a range of a voltage level change of the write pulse corresponding to a pulse width change of the write pulse.

DETAILED DESCRIPTION

Various embodiments are described below with reference to the accompanying drawings, in order to describe in detail the present disclosure so that those with ordinary skill in art to which the present disclosure pertains may easily carry out the technical spirit of the present disclosure.

Figure 1:
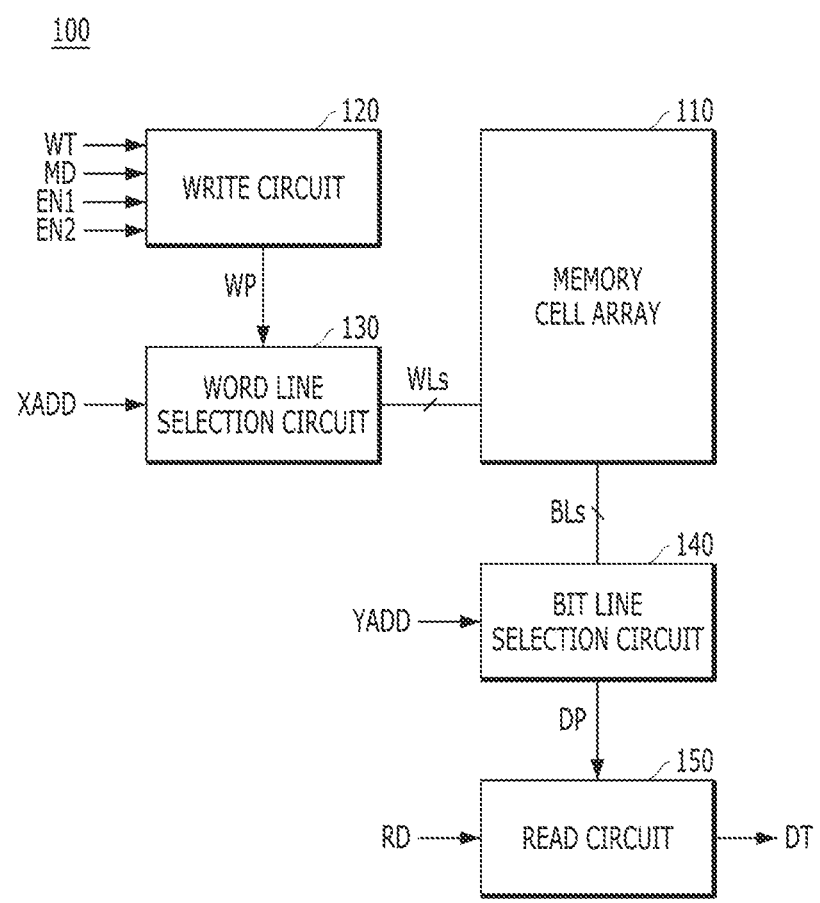
FIG. 1 is a block diagram illustrating a nonvolatile memory device in accordance with an embodiment of the disclosed technology.

FIG. 1 is a block diagram illustrating a nonvolatile memory device 100 in accordance with an embodiment.

Referring to FIG. 1, the nonvolatile memory device 100 may include a memory cell array 110, a write circuit 120, a word line selection circuit 130, a bit line selection circuit 140 and a read circuit 150.

The memory cell array 110 may include a plurality of memory cells disposed at intersections of a plurality of word lines WLs and a plurality of bit lines BLs. In some implementations, each of the plurality of memory cells may include a resistance change layer which exhibits different resistance states at different resistance values in response to a control signal (e.g., a voltage pulse) and may exhibit a resistance change in response to the control signal to change its resistance state. Different resistance states can be used to represent different logic levels for storing data and thus store data therein according to a resistance state. The resistance change layer may be a resistive layer (e.g., a metal oxide) sandwiched between two metal electrodes to exhibit a resistance change property in which a resistance value is changed between a high resistance state and a low resistance state according to the magnitude or polarity of an external voltage (for example, a write pulse WP) applied across the two metal electrodes. The resistance change layer may have a memory function of maintaining a changed resistance value when the external voltage is removed so that such a structure can be used as a nonvolatile memory cell as a resistive random access memory (RRAM) cell. For example, the resistance change layer may have a characteristic in which a range of a change in a voltage level of a read pulse VREAD, which corresponds to a change in a pulse width of the read pulse VREAD, falls within a range of a change in a voltage level of the write pulse WP, which corresponds to a change in a pulse width of the write pulse WP (refer to FIG. 5). For example, in some implementations, the resistance change layer may include at least one of silver (Ag) and/or copper (Cu) in form of a silver oxide or copper oxide.

The write circuit 120 may generate the write pulse WP based on a write enable signal WT, a mode selection signal MD, a set enable signal EN1 and a reset enable signal EN2. In response to the write enable signal WT, the write circuit 120 may be enabled in a write mode and generate the write pulse WP to change the resistance state of the resistance change layer to effectuate the write operation in a memory cell. The write circuit 120 may determine a waveform of the write pulse WP optimized for first to third operation modes for the write operation based on the mode selection signal MD (refer to FIG. 7), and determine the polarity of the write pulse WP based on the set enable signal EN1 and the reset enable signal EN2.

The word line selection circuit 130 may couple a word line selected among the plurality of word lines WLs to the write circuit 120 based on a word line selection signal XADD. The word line selection circuit 130 may provide the selected word line with the write pulse WP.

The bit line selection circuit 140 may couple a bit line selected among the plurality of bit lines BLs to the read circuit 150 based on a bit line selection signal YADD. The bit line selection circuit 140 may provide the selected bit line with a data pulse DP. The data pulse DP may correspond to a data value stored in a memory cell selected among the plurality of memory cells.

The read circuit 150 may generate read data DT, which corresponds to the data pulse DP, based on a read enable signal RD. In response to the read enable signal RD, the read circuit 150 may be enabled in a read mode to generate the read pulse VREAD. And the read circuit 150 may generate the read data DT based on the read pulse VREAD and the data pulse DP.

Figure 2:
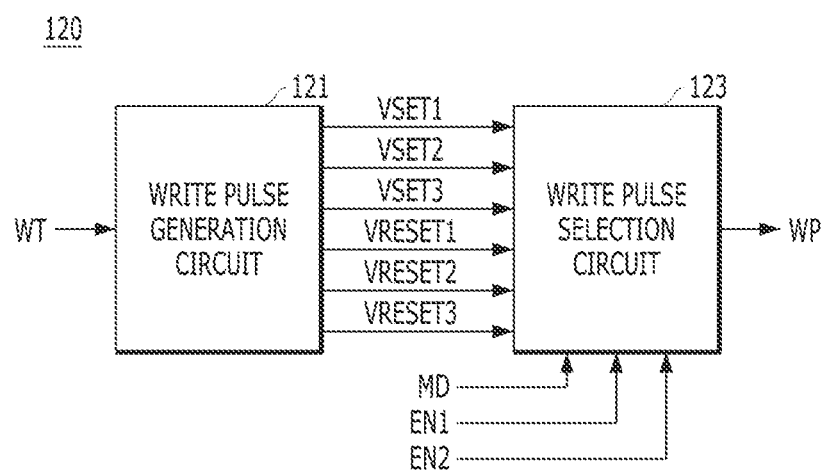
FIG. 2 is a block diagram illustrating a write circuit illustrated in FIG. 1.

FIG. 2 is a block diagram illustrating the write circuit 120 illustrated in FIG. 1.

Referring to FIG. 2, the write circuit 120 may include a write pulse generation circuit 121 and a write pulse selection circuit 123.

The write pulse generation circuit 121 may generate, based on the write enable signal WT, first to third set pulses VSET1 to VSET3 and first to third reset pulses VRESET1 to VRESET3 corresponding to the first to third operation modes in performing a write operation. The first operation mode of the write operation may be a writing mode requiring a high-speed operation in writing data to a memory cell by using a short voltage pulse with a high voltage value (e.g., VSET1 in FIG. 7), the third operation mode may be a mode requiring a low-voltage operation with a slow writing speed (a long pulse width) and a low voltage level in writing data to a memory cell (e.g., VSET3 in FIG. 7), and the second operation mode may be a mode requiring an appropriate speed between the speeds in the first and second modes and an appropriate voltage between the write voltage levels in the first and third modes (e.g., VSET2 in FIG. 7). The write pulse generation circuit 121 may generate the first to third set pulses VSET1 to VSET3 and first to third reset pulses VRESET1 to VRESET3 optimized for each write operation mode based on the characteristic of the resistance change layer.

The write pulse selection circuit 123 may select any one of the first to third set pulses VSET1 to VSET3 and first to third reset pulses VRESET1 to VRESET3 and output the selected pulse, as the write pulse WP based on the mode selection signal MD, the set enable signal EN1 and the reset enable signal EN2.

Figure 3:
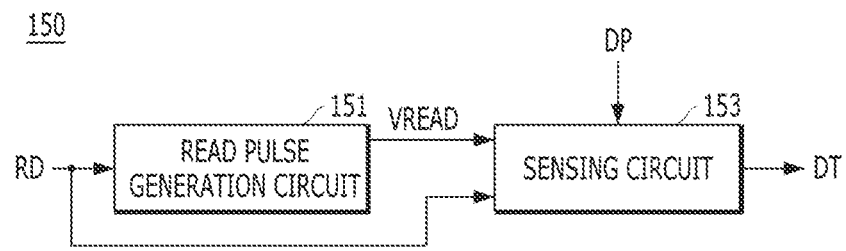
FIG. 3 is a block diagram illustrating a read circuit illustrated in FIG. 1.

FIG. 3 is a block diagram illustrating the read circuit 150 illustrated in FIG. 1.

Referring to FIG. 3, the read circuit 150 may include a read pulse generation circuit 151 and a sensing circuit 153.

The read pulse generation circuit 151 may generate the read pulse VREAD based on the read enable signal RD. The read pulse generation circuit 151 may generate the read pulse VREAD to read the resistance state of a memory cell without changing the resistance state in consideration of the characteristic of the resistance change layer so that a voltage margin between the write pulse WP and the read pulse VREAD is sufficient. For example, the read pulse generation circuit 151 may set a target voltage level of the read pulse VREAD so that a difference between the voltage level of the write pulse WP and the voltage level of the read pulse VREAD corresponds to $2/3$ to $1/10$ times the voltage level of the write pulse WP (which is referred to as a first condition) according to the characteristics of the resistance change layer. The read pulse generation circuit 151 may set a target pulse width of the read pulse VREAD so as to correspond to $1/10$ to $1/1000$ times a reference pulse width (which is referred to as a second condition) according to the characteristic of the resistance change layer. The reference pulse width may be a pulse width corresponding to an intersection of a first characteristic curve indicating the change in the voltage level of the write pulse WP corresponding to the change in the pulse width of the write pulse WP and a second characteristic curve indicating the change in the voltage level of the read pulse VREAD according to the change in the pulse width of the read pulse VREAD. The read pulse generation circuit 151 may set the target voltage level and target pulse width of the read pulse VREAD so as to satisfy any one of the first and second conditions or satisfy both of the first and second conditions.

The sensing circuit 153 may generate, based on the read pulse VREAD and the data pulse DP, the read data DT which corresponds to the data value stored in the selected memory cell. The sensing circuit 153 generates and uses the read pulse VREAD in consideration of the characteristic of the resistance change layer, which makes it possible to prevent undesired read disturbance in which the data value stored in the selected memory cell (which is represented by a resistance state of the resistance change layer) unintentionally changes due to the read pulse VREAD during the read operation.

Hereinafter, an operation of the nonvolatile memory device 100 in accordance with an embodiment, which has the above-described configuration, is described with reference to FIGS. 4 and 7.

Figure 4:
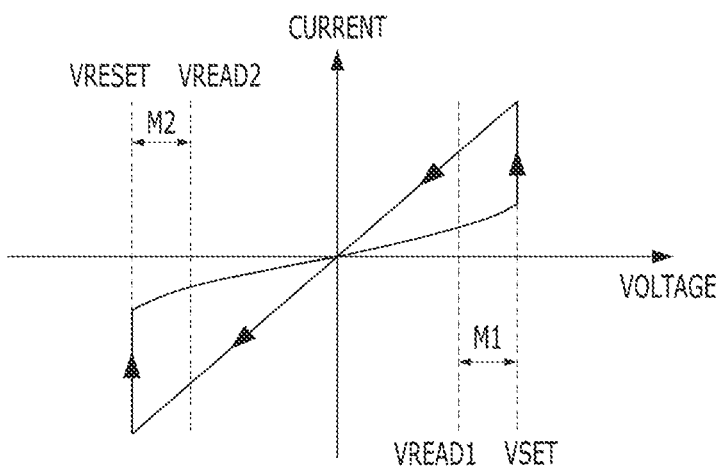
FIGS. 4 to 7 are diagrams illustrating an operation of the nonvolatile memory device in accordance with an embodiment of the disclosed technology.

FIG. 4 is a graph diagram illustrating an operation of storing data in a selected memory cell in the write mode.

Referring to FIG. 4, the memory cell has a characteristic in which a resistance value changes according to a current and the changed resistance value is maintained. For example, the resistance value is changed when the write pulse WP satisfies predetermined conditions. Unless an event that the write pulse WP satisfies the predetermined conditions, the resistance value is maintained.

In the memory cell illustrated in FIG. 4, when the write pulse WP applied to the memory cell has a positive (+) voltage level, the current flowing through the memory cell may increase, and when the write pulse WP is equal to or greater than a threshold voltage level of the set pulse VSET, the current flowing through the memory cell may increase rapidly (see the arrow in FIG. 4 when the write pulse WP has the voltage, VSET). This high voltage of the write pulse WP equal to or greater than the threshold set pulse voltage VSET, the memory cell may change its resistance state by transiting from a high resistance state to a low resistance state as illustrated in FIG. 4. When the read pulse VREAD is set to a first voltage level VREAD1 below the threshold set pulse VSET to avoid changing the cell's resistance state in a read operation, a voltage level between the write pulse WP and the read pulse VREAD may have a first margin M1 in the read operation.

When the write pulse WP applied to the memory cell has a negative (−) voltage level, the current flowing through the memory cell may increase, and when the negative write pulse WP is equal to or greater than a threshold voltage level of the reset pulse VRESET, the current flowing through the memory cell may decrease rapidly to cause the resistance state to change from the low resistance state to a high resistance state. When the read pulse VREAD is set to a second voltage level VREAD2 as a negative read voltage with a voltage level lower than the threshold VRSET, a voltage level between the write pulse WP and the read pulse VREAD may have a second margin M2 in the read operation.

Therefore, the application of the current and voltage to a memory cell may cause the memory cell to repeatedly undergo the phenomenon in which the current increases and decreases rapidly according to a voltage.

Figure 5:
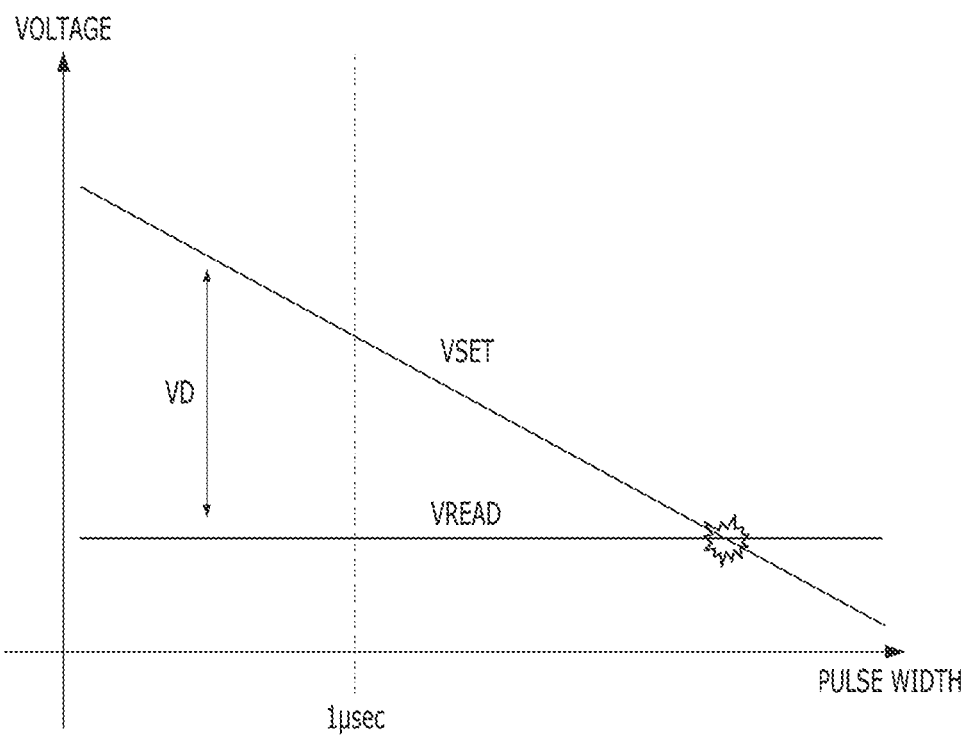

FIG. 5 is a graph diagram illustrating the characteristic of the resistance change layer in one example of a memory cell. FIG. 5 illustrates a first characteristic curve corresponding to the set pulse VSET and a second characteristic curve corresponding to the read pulse VREAD.

Referring to FIG. 5, the resistance change layer of the memory cell may have a characteristic in which a range of a voltage level change of the read pulse VREAD according to a pulsed width change of the read pulse VREAD falls within a range of a voltage level change of the set pulse VSET according to a pulse width change of the set pulse VSET.

The target voltage level of the read pulse VREAD may be set so that a difference VD between the voltage level of the set pulse VSET and the voltage level of the read pulse VREAD corresponds to $2/3$ to $1/10$ times the voltage level of the set pulse VSET according to the characteristic of the resistance change layer.

The target pulse width of the read pulse VREAD may be set to correspond to $1/10$ to $1/1000$ times the reference pulse width according to the characteristic of the resistance change layer. The reference pulse width may be a pulse width corresponding to an intersection of the first characteristic curve indicating the change in the voltage level of the set pulse VSET according to the change in the pulse width of the set pulse VSET and the second characteristic curve indicating the change in the voltage level of the read pulse VREAD according to the change in the pulse width of the read pulse VREAD. For example, when the pulse width corresponding to the intersection of the first characteristic curve and the second characteristic curve is 10 μsec to 1 msec, the target pulse width of the read pulse VREAD may be set to 1 μsec or less.

Figure 6:
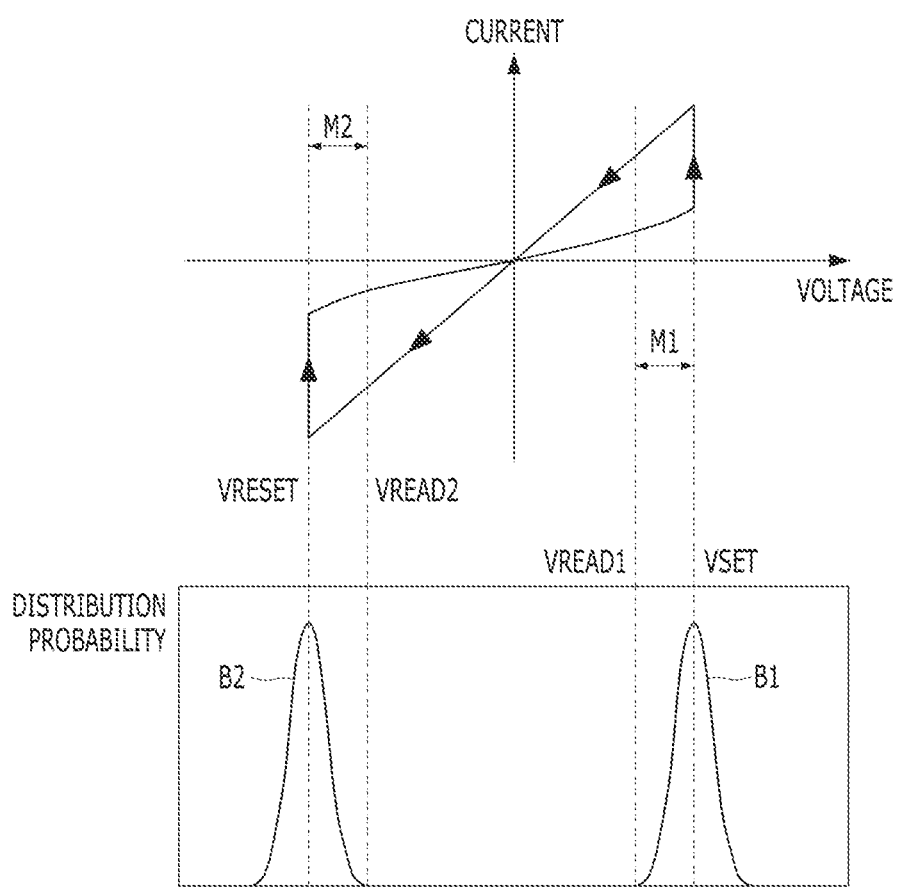

FIG. 6 is a graph diagram illustrating the read disturbance.

Referring to FIG. 6, when the read pulse VREAD is generated in consideration of the characteristic of the resistance change layer, the read disturbance may be prevented due to the sufficient margins M1 and M2. For example, when the read pulse VREAD is set to the first voltage level VREAD1, there is the first sufficient margin M1 between the voltage level of the set pulse VSET and the first voltage level VREAD1 of the read pulse VREAD. Therefore, in the read mode, the read pulse VREAD does not affect distribution B1 of the memory cells each having the low resistance state. Alternatively, when the read pulse VREAD is set to the second voltage level VREAD2, there is the second sufficient margin M2 between the voltage level of the reset pulse VRESET and the second voltage level VREAD2 of the read pulse VREAD. Therefore, in the read mode, the read pulse VREAD does not affect distribution B2 of the memory cells each having the high resistance state.

Figure 7:
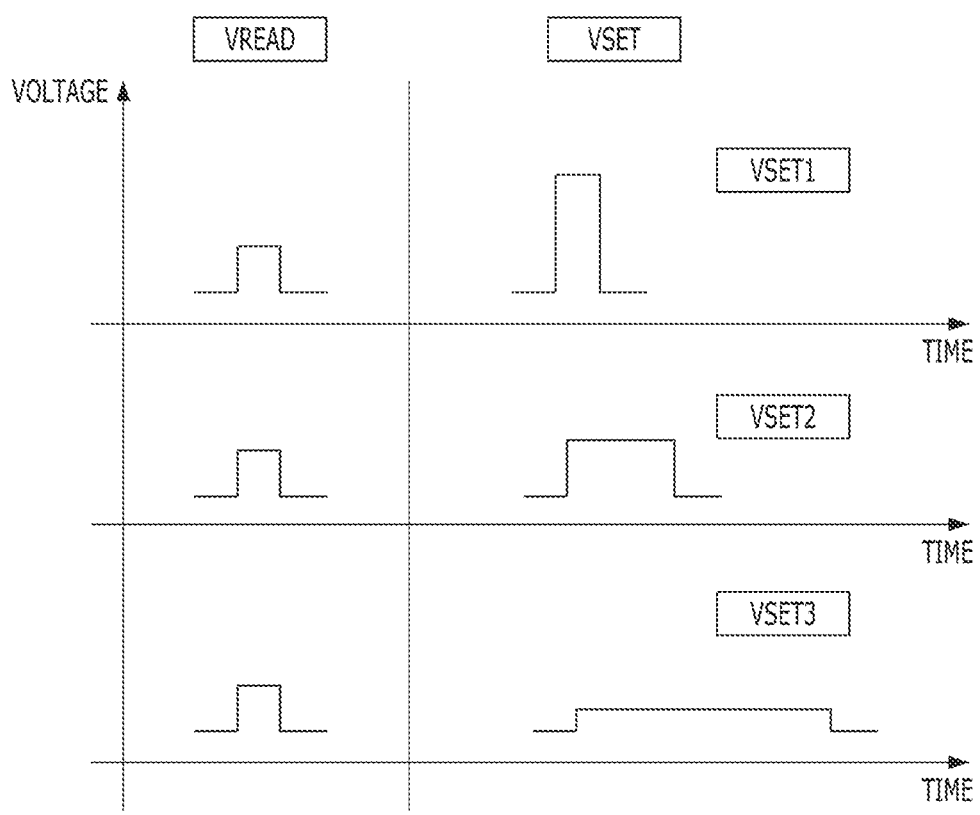

FIG. 7 is a diagram illustrating the write pulse WP and the read pulse VREAD according to the first to third operation modes in an operating operation. For convenience in description, the set pulse VSET is described as an example.

Referring to FIG. 7, the first operation mode in writing may be a mode requiring a high-speed writing operation. Accordingly, in the first write operation mode, the write pulse generation circuit 121 may generate a first set pulse VSET1 having the highest first voltage level and the smallest first pulse width among the first to third operation modes.

The third write operation mode may be a writing mode requiring a low-voltage write operation. Accordingly, in the third operation mode, the write pulse generation circuit 121 may generate a third set pulse VSET3 having the lowest second voltage level and the largest second pulse width among the first to third write operation modes.

The second write operation mode may be a writing mode requiring an appropriate speed and an appropriate voltage. Accordingly, in the second write operation mode, the write pulse generation circuit 121 may generate a second set pulse VSET2 having a third voltage level between the first voltage level and the second voltage level and a third pulse width between the first pulse width and the second pulse width.

According to an embodiment of the present disclosure, it is possible to use an optimized write pulse in a write mode while preventing read disturbance in a read mode.

According to an embodiment of the present disclosure, read disturbance may be reduced, which makes it possible to improve operational reliability during a read operation.

While specific examples of certain embodiments of the disclosed technology are provided, variations and enhancements of the disclosed embodiments and other embodiments may be made based on what is disclosed or illustrated.

What is claimed is:

1. A nonvolatile memory device comprising:
    a plurality of memory cells operable to store data, each memory cell structured to include a resistance change layer exhibiting different resistance states with different resistance values for representing data;
    a write circuit in communication with the memory cells and suitable for generating a write pulse in a write mode to write data in a memory cell of the plurality of memory cells wherein the write pulse has a voltage level depending on a pulse width of the write pulse; and
    a read circuit in communication with the memory cells and suitable for generating a read pulse in a read mode to read data from a memory cell of the plurality of memory cells, wherein the read pulse has a voltage level depending on a pulse width of the read pulse,
    wherein the resistance change layer has a characteristic in which a range of a voltage level change of the read pulse corresponding to a pulse width change of the read pulse is within a range of a voltage level change of the write pulse corresponding to a pulse width change of the write pulse.

2. The nonvolatile memory device of claim 1, wherein the read circuit is further configured to set a target voltage level of the read pulse so that a difference between the voltage level of the write pulse and the voltage level of the read pulse corresponds to $2/3$ to $1/10$ times the voltage level of the write pulse according to the characteristics of the resistance change layer.

3. The nonvolatile memory device of claim 1, wherein the read circuit is further configured to set a target pulse width of the read pulse to correspond to $1/10$ to $1/1000$ times a reference pulse width according to the characteristic of the resistance change layer.

4. The nonvolatile memory device of claim 3, wherein the reference pulse width is a pulse width corresponding to an intersection of a first characteristic curve indicating the voltage level change of the write pulse according to the pulse width change of the write pulse and a second characteristic curve indicating the voltage level change of the read pulse according to the pulse width change of the read pulse.

5. The nonvolatile memory device of claim 1, wherein the read circuit is further configured to set a target voltage level of the read pulse so that a difference between the voltage level of the write pulse and the voltage level of the read pulse corresponds to $2/3$ to $1/10$ times the voltage level of the write pulse according to the characteristics of the resistance change layer, and
wherein the read circuit is further configured to set a target pulse width of the read pulse to correspond to $1/10$ to $1/1000$ times a reference pulse width according to the characteristic of the resistance change layer.

6. The nonvolatile memory device of claim 5, wherein the reference pulse width is a pulse width corresponding to an intersection of a first characteristic curve indicating the voltage level change of the write pulse according to the pulse width change of the write pulse and a second characteristic curve indicating the voltage level change of the read pulse according to the pulse width change of the read pulse.

7. The nonvolatile memory device of claim 1, wherein the read circuit includes:
a read pulse generation circuit suitable for generating the read pulse in response to a read enable signal; and
a sensing circuit suitable for generating read data stored in a memory cell selected among the plurality of memory cells, based on the read pulse and data pulse provided through the selected memory cell.

8. The nonvolatile memory device of claim 1, wherein the resistance change layer includes at least one of silver (Ag) or copper (Cu).

9. The nonvolatile memory device of claim 1, wherein the write circuit is suitable for generating the write pulse corresponding to a plurality of operation modes, according to the characteristic of the resistance change layer.

10. The nonvolatile memory device of claim 1, wherein the write circuit is suitable for generating a first write pulse with a first pulse width and a first voltage level, a second write pulse with a second pulse width greater than the first pulse width and a second voltage level less than the first voltage level, and a third write pulse with a third pulse width greater than the second pulse width and a third voltage level less than the second voltage level.

11. The nonvolatile memory device of claim 1, wherein the write circuit includes:
a write pulse generation circuit suitable for generating, in response to a write enable signal, a plurality of set pulses and a plurality of reset pulses, which correspond to a plurality of operation modes; and
a write pulse selection circuit suitable for outputting, as the write pulse, any one of the plurality of set pulses and the plurality of reset pulses based on a mode selection signal, a set enable signal and a reset enable signal.

12. A nonvolatile memory device, comprising:
a memory cell array including memory cells, each memory cell having a resistance change layer having a resistance that varies between a high resistance state and a low resistance state for storing data;
a write circuit in communication with the memory cell array and configured to receive a mode selection signal and generate a write pulse for writing data to a memory cell based on a selected mode; and
a read circuit in communication with the memory cell array and configured to generate a read pulse to read data stored in the memory cell without changing a resistance state of the memory cell, and
wherein a range of a voltage level change of the read pulse corresponding to a pulse width change of the read pulse falls within a range of a voltage level change of the write pulse corresponding to a pulse width change of the write pulse.

13. The nonvolatile memory device of claim 12, wherein the resistance change layer includes at least one of silver (Ag) or copper (Cu).

14. The nonvolatile memory device of claim 12, wherein the resistance of the resistance change layer depends on at least one of polarity or magnitude of the write pulse.

15. The nonvolatile memory device of claim 12, wherein the write circuit is configured to receive the mode selection signal that is one of a first operation mode operated at a first operation speed, a second operation mode at a second operation speed slower than the first operation speed, or a third operation mode at a third operation speed slower than the third operation speed.

16. The nonvolatile memory device of claim 15, wherein the first operation mode operates at a first operation voltage, a second operation mode at a second operation voltage smaller than the first operation voltage, or a third operation mode at a third operation voltage smaller than the second operation voltage.

17. The nonvolatile memory device of claim 12, wherein the read circuit is further configured to set a voltage level of the read pulse so that a difference between a voltage level of the write pulse and the voltage level of the read pulse corresponds to $2/3$ to $1/10$ times the voltage level of the write pulse.

18. The nonvolatile memory device of claim 12, wherein the read circuit is further configured to set a pulse width of the read pulse to correspond to $1/10$ to $1/1000$ times a reference pulse width.

19. The nonvolatile memory device of claim 18, wherein the reference pulse width is a pulse width corresponding to an intersection of a first characteristic curve indicating the voltage level change of the write pulse according to the pulse width change of the write pulse and a second characteristic curve indicating the voltage level change of the read pulse according to the pulse width change of the read pulse.

* * * * *